United States Patent

Wellhausen

[15] 3,671,870

[45] June 20, 1972

[54] TUNING SYSTEM FOR COMMUNICATION RECEIVERS STORING PREDETERMINED TUNING POSITIONS WITHIN THE RECEIVER FREQUENCY BAND

[72] Inventor: Heinz Wellhausen, Hildesheim, Germany

[73] Assignee: Blaukunkt-Werke GmbH, Hildesheim, Germany

[22] Filed: April 1, 1970

[21] Appl. No.: 24,513

[30] Foreign Application Priority Data

April 2, 1969 Germany ....................... P 19 16 834.4

[52] U.S. Cl. ....................................... 325/470, 334/29

[51] Int. Cl. ........................................... H04b 1/34

[58] Field of Search .................. 325/469, 470, 471, 334, 422, 325/468; 307/227, 282; 328/39.5; 334/26, 29, 88, 78

[56] References Cited

UNITED STATES PATENTS

| | | | |
|---|---|---|---|
| 3,492,584 | 1/1970 | Takahashi | 325/469 X |
| 3,550,009 | 12/1970 | French | 325/469 X |
| 3,293,572 | 12/1966 | Smith | 325/471 X |
| 3,482,109 | 12/1969 | Yii | 307/282 X |
| 3,528,015 | 9/1970 | Buhr | 325/471 |
| 3,575,661 | 4/1971 | Slavik | 325/468 X |

*Primary Examiner*—Robert L. Griffin
*Assistant Examiner*—Kenneth W. Weinstein
*Attorney*—Flynn & Frishauf

[57] ABSTRACT

The receiver is designed to provide a control signal varying the tuning frequency thereof, for example derived from a signal searching system (7). A pulse source (9) and a digital stepping circuit (11), controlled by the pulse source provides a stepped, digitally changing signal, in a binary progression. A comparator circuit (12) has said stepped signal and said tuning control signal applied thereto, and compares a characteristic, typically voltage, of the signals. Upon detection of coincidence, a characteristic of the signal, for example voltage, is stored, for example as a level of magnetization in a transfluxor core (FIG. 4) or as the count of a flip-flop chain, including magnetic cores, in the digital stepping circuit. Upon re-energization of the receiver after disconnection, a voltage value derived from the digital stepping circuit, or from the storing means can be directly applied to the tuning control, or the signal search system, respectively, so that the receiver will be pre-tuned to the selected frequency.

18 Claims, 5 Drawing Figures

Inventor:

HEINZ WELLHAUSEN by [signature] Attys

TUNING SYSTEM FOR COMMUNICATION RECEIVERS STORING PREDETERMINED TUNING POSITIONS WITHIN THE RECEIVER FREQUENCY BAND

The present invention relates to tuning systems for radio receivers and more particularly to tuning systems for receivers of the signal searching type in which the receiver is progressively tuned over its frequency band and, when a signal of sufficient strength for proper reception is received, progressive tuning is interrupted to reproduce the program from the particular station.

When tuning radio receivers it is frequently desirable to provide a system in which the tuning position of a particular station can be recorded or stored. This is particularly important in signal searching receivers with respect to stations which are at the terminal end of the search cycle. Usually, if a receiver is turned off, and thereafter re-energized, control voltages which start the searching cycle begin at a turn-on, low value, so that at first, upon re-energization, those transmitters are located which are closest to the beginning of the tuning range within the tuning cycle of the searching system. Subsequent transmitters are then received only after searching for the next, and then subsequent signals. Thus, in order to reach a transmitter near the terminal end of the search cycle, all preceding transmitters have to be first located and skipped.

It has previously been proposed to provide for mechanical storage of a particular tuning position, so that a certain station, upon re-energization of the receiver, will again be tuned. This requires additional mechanical devices, and further additional manual tuning arrangements in order to give the user a free choice of stations, the tuning position of which is to be stored. Manual tuning of specific transmitters, and selection of stations to be tuned is particularly undesirable in automobile receivers since the operation of the radio, and the tuning detracts from attention to driving. Accurate reproduction of a tuning position is difficult, particularly in automobile receivers, and an indicator scale has to be provided coupled to tuning knobs in order to indicate the particular station being received. This coupling of mechanical parts requires costly components and accurate manufacture.

It is an object of the present invention to provide a storage system for the tuning position of a receiver tunable over a predetermined frequency band, particularly of a signal searching type receiver, in which the storage of the tuning position is entirely electronic and a previously tuned station can be quickly selected after re-energization of the receiver.

SUBJECT MATTER OF THE PRESENT INVENTION

Briefly, a control signal is provided which varies with the tuning of the receiver over its frequency band. A pulse source, and a digitel stepping circuit, controlled by the pulse source provide a stepped, digitally changing signal in a binary progression. A comparator circuit has the digitally stepped, binary progressing signal, as well as the tuning control signal applied thereto, to compare a characteristic of the signals. When the signal controlling the tuning of the receiver, and the binary stepped signal characteristics match, the characteristics of one (or the other) of these signals is stored magnetically, to hold the storage condition also upon disconnection of power. Thus, by holding the count of the digitally stepped signal, the tuning frequency of the receiver can be re-established at all times by stepping the stepped signal to the stored binary count, and providing the tuning control signal corresponding to the particular count.

The invention is particularly applicable to a signal search receiver having a signal searching system providing a signal which is connected to one input of the comparator and controlling the tuning of the receiver through its band; the comparator then is adjusted to permit stepping of the stepping circuit until the voltage level of the signal from the stepping circuit matches the control signal for a particular tuning position applied by the signal searching system. The voltage value supplied by the stepping circuit is then stored when the comparator indicates coincidence. This stored voltage can be applied to the tuning system of the receiver, or to the search system, respectively, if the receiver is re-energized after an interruption, thus immediately providing for tuning of the receiver at the selected station.

The stepped voltage, changing in binary, digital steps, can be generated by ring counters, matrix storage devices, transfluxor and the like, which are stepped in sequence by a pulse source, similar to a clock. When the clock is stopped, or the stepping circuit inhibited, and as soon as the control potential (for example as determined by the control for the search system) has the same value, then the value of the control potential, or of the stepped voltage, respectively, will correspond to a tuning position of the receiver. This voltage is then stored, either automatically or upon operation of a push button or key, when the receiver is disconnected. A particularly simple system is obtained by building up the ring counter of a series of flip-flops having magnetic switching-type cores.

The stepped voltage can change in the same, or opposite sense as the voltage controlling the search system. The circuit should be so arranged that, upon re-energizing the receiver after prior disconnection, the search will continue in the previously commanded direction. Slight mistunings can be easily compensated, even if the steps are comparatively great, and a transmitter is to be selected which is close to the transmitter previously tuned, and located at the side of the dial in the direction of the search cycle.

The invention will be described by way of example with reference to the accompanying drawings, wherein.

Figure 1:
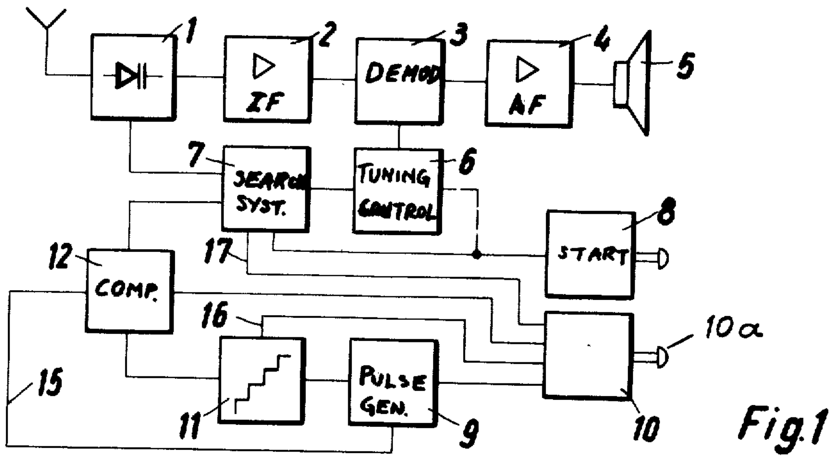
FIG. 1 is a simplified schematic block diagram of a receiver with a signal search system and having a storage button to store a selected transmitter position.

A radio receiver having a variable capacity diode tuning arrangement 1 has an intermediate frequency amplifier 2, a demodulator 3, a low frequency amplifier 4 and a reproducer, such as a loud speaker 5. The demodulator 3 (or the last intermediate frequency stage) provides a signal to a tuning adjustment stage 6 which controls a search signal system 7 providing a continuously variable d-c voltage which controls the capacity of the variable capacity diode in the tuning system of the receiver. The output voltage from unit 7 varies in the form of a sawtooth wave and, after reaching a certain limit, reverts back to an initial value, so that the receiver is continuously, and cyclically tuned through its frequency range. If, during this tuning, a signal is received from a transmitter of sufficient strength to warrant reproduction, then the transmitter selection stage 6 provides a control potential to the search system 7 which inhibits further change in voltage, and provides an automatic sharp tuning with high control resolution. A further transmitter supplying a suitable signal can be selected by subsequent operation of start button 8, to again initiate search of the signal by the receiver.

In accordance with the present invention, the receiver includes a pulse source 9 which, upon operation of push button 10a causes circuit 10 to provide pulses to a stepping circuit 11, which has a stepped output voltage, as schematically indicated in FIG. 1. The stepped output voltage is compared in a voltage comparator 12 with a control potential for the tuning of the receiver, derived from the signal search unit 7. Upon detection of coincidence, or almost coincidence of the voltages from unit 7 and from unit 11, the comparator 12 provides a stop output pulse over line 15 to inhibit further generation of pulses from pulse source 9. If, upon re-energization of the receiver after an interruption, then the voltage supplied from unit 11, (which, of course, is the same as that supplied to the tuning control 1 of the receiver,) is connected over lines 16 and 17 to the search system, and thus to the tuning control so that further signal searching will start from the previously tuned transmitter. In order to provide signal searching in the correct direction with respect to the stored transmitter position, the stepwise change may vary counter the change of the tuning control potential upon searching for a signal within the band of the receiver. The signal search arrangement 7 will thereby, by itself, compensate for any errors or deviations which may arise due to delays, for example that the step voltage is interrupted, upon storage, only when the voltages to be compared have already been exceeded, that is that the stepped voltage would start at the next subsequent step after interruption.

If the stepped voltage varies in the same sense as the tuning voltage, then the comparator 12 can be so adjusted that an interrupting signal is generated at one step below exact coincidence, for example by providing a small fixed bias to the comparator 12.

Figure 2:
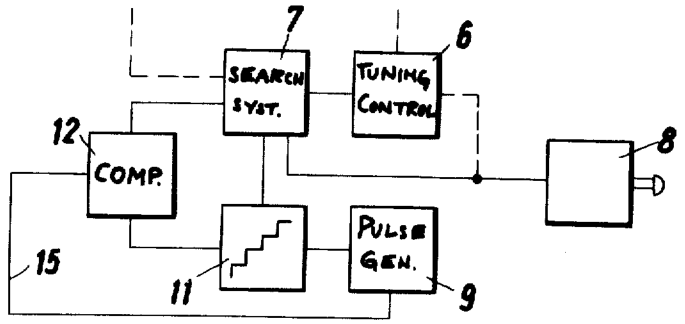
FIG. 2 is a partial diagram of FIG. 8 in which, upon disconnecting the receiver, a particular tuned frequency position is maintained.

FIG. 2 illustrates a storage system for use with an automatic signal search arrangement as illustrated in FIG. 1. Pulse generator 9 causes stepping of unit 11 until a stop signal is received over line 15. The system is so adjusted that the stepped voltage, obtained from the digitally, binary progressing stages of unit 11 always lags behind the voltage controlling the tuning of the receiver. Supply of the stepped voltage is interrupted by the comparator 12, over line 15, as soon as a predetermined gap between the tuning control potential, and the step potential is reached. If a system, as illustrated in part in FIG. 2. (the portions not shown, therein, are identical to those of FIG. 1) is interrupted, the last switching position of the digital stages 11 will remain stored in the system. Upon re-energization of the receiver, an output potential will be derived from the stepping unit 11 which corresponds to the stored tuning position. This output potential will be greater than the voltage derived from the search system unit 7, itself, since this system starts with a low value upon recycling. By interposition of properly poled diodes, this larger potential, stored at the stepping stage 11, will be applied to the tuning circuit 1. This control signal, controlling a specific tuning point, inhibits supply of a voltage from the tuning control stage 6 which will be opposite to the change in voltage of the cycling direction of the signal search arrangement 7, or inhibit further continued operation thereof. Thus, the voltage of the signal search system will increase until it is even with the voltage directly supplied from the stepping circuit 11. When the voltage from the stepping circuit 11 is exceeded, control of the tuning of the receiver has been recaptured by the signal search system. In this arrangement, the comparator is so connected that line 15 supplies a stop signal until the voltage from the signal searching arrangement 7 is greater than one step of the voltage derived from stepping circuit 11. Cycling of the signal search system can also be started by a further switching stage which, controlled by comparator 12, bridges the starting circuit 8.

Figure 3:
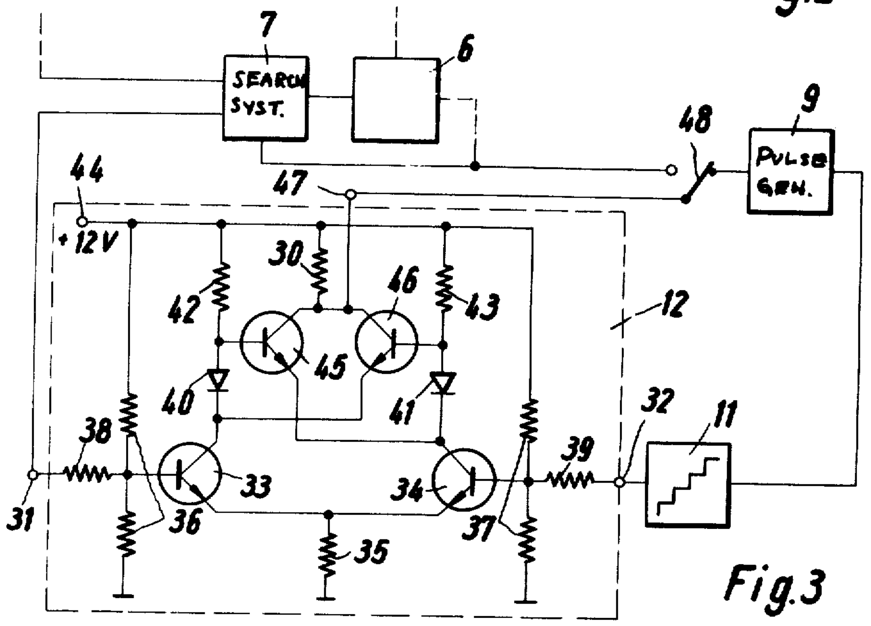
FIG. 3 is a partial block, partial schematic circuit diagram of a differential amplifier to control storage.

FIG. 3 illustrates a circuit arrangement for the voltage comparator 12, and its interconnection with pulse source 9 and stepping source 11. A common output resistance 30 is so connected that it has a voltage extreme, for example a minimum, applied thereacross when the voltages connected to the two inputs of circuit 12, terminals 31, 32, are equal, or approximately equal. Comparator 12 is, essentially, a differential amplifier, having a pair of npn input transistors 33, 34, each having their emitters connected over a common emitter resistor 35 to ground potential. Each base of input transistor 33, 34 is connected to a separate voltage divider 36, 37. The tap points of the voltage dividers are connected over input resistances 38, 39 with inputs 31, 32 respectively. Diodes 40, 41 are connected to the collectors of transistors 33, 34, poled in forward direction. Load resistances 42, 43 connect the diodes 40, 41 to a terminal 44 providing a positive working voltage, for example of +12 V. The junction between the diodes 40, 41, and resistances 42, 43 are connected to the bases of two npn output transistors 45, 46. The collectors of the two transistors are interconnected to one terminal of the output resistance 30, the other terminal of which connects to the positive source 44. The emitters of the transistors 45, 46 are connected to the collectors of transistors 34 and 33, respectively (see FIG. 3).

If the input voltages at input 31, 32 are unequal, the input transistor having the higher, or more positive base voltage, will be highly conductive and controls output transistor 45, or 46, respectively into conduction, so that the voltage drop across resistance 30 will be substantial. If, however, the voltages at the two inputs 31, 32 are approximately equal, then both output transistors 45, 46 will block and the voltage at the lower terminal (FIG. 3) of resistance 30 will be approximately that of the supply voltage of terminal 44. The voltage across the diodes 40, 41 will be small, and essentially independent of the current through input transistors 33, 34, just sufficient to provide for blocking of the output transistors.

The two input voltages need not be exactly equal; if the minimum voltage across resistor 30 is to be obtained o already when the input voltages at terminals 31, 32 are only substantially equal, then diodes 40, 41 can be left off and the bases of the respective output transistors 45, 46 can be connected directly to the collectors of the opposite input transistor; alternatively, the diodes may be replaced by small resistances.

If a small, not sharply varying output signal suffices to control the entire receiver, then the output resistance can be connected back with the load resistances 42, 43 over forwardly biassed diodes, and the output transistors can be eliminated entirely. By suitable adjustment and choice of the resistances connected to the bases of the input transistors, an output signal can be obtained at selected differences between potentials, for example corresponding to one step of the stepped voltage from unit 11.

Output terminal 47 connected to the collectors of the output transistors 45, 46 is connected to a switch 48, as well as to the pulse generator 9. Thus, when connected to the pulse generator to store a tuning voltage, a stop signal can be provided to the digital stepping circuit 11. When the switch is in the other connection, (not shown in FIG. 3) then, while pulse generator 9 is not energized, the search system 7, or, respectively, the tuning system of the receiver will have a voltage applied thereto which will control the tuning of the input circuit and will cause the signal search system to continuously supply rising coltages until the tuning control voltage is of such value that corresponds to the stored stepped voltage applied to terminal 32 from the stepped voltage source 11.

Figure 4:
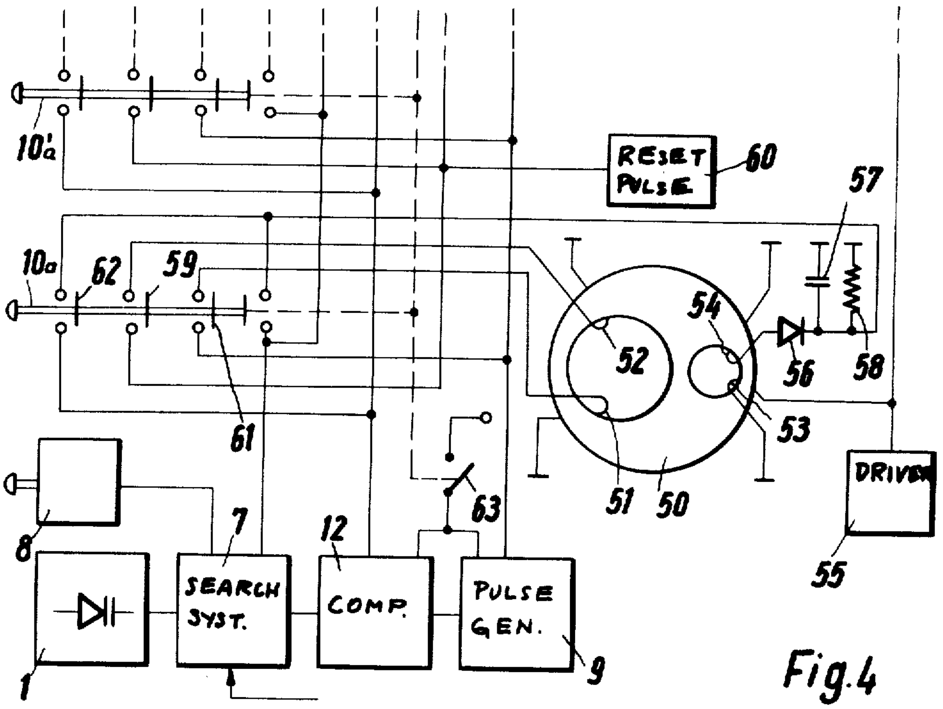
FIG. 4 is a partial schematic, partial block diagram of a receiver illustrating various possibilities of storing a tuning position.

FIG. 4 is a highly schematic circuit diagram of a digitally operating stage providing a storable stepped output voltage. A transfluxor 50, having a pair of holes, is connected, as known, with a control winding 51, a reset winding 52, a driver winding 53 and an output winding 54. Reset winding 52 is connected into the control circuit, and output winding 54 into the transfer circuit. The transfluxor is controlled into saturation by square wave pulses derived from pulse generator 9. An alternating potential from driver source 55 applied to the driving winding of transfluxor 50 will induce a signal of stepped amplitude in output winding 54. Rectification of the output alternating current, by means of a diode, and filtering by a condenser 57 will provide an output voltage across output resistance 58 which will be a direct voltage changing in steps.

If a tuning potential applied to the tuning control 1 of the receiver, for example derived from the search system 7, is to be stored, then one of the storage buttons 10*a*, 10'*a* are briefly pulled to the left (in relation to FIG. 4). The particular transfluxor associated with the particular button (that is, the particular tuning stage) then receives, over contact 59, a reset pulse from a reset source 60. A further contact 61 provides pulses from pulse generator 9 to the control winding 51 until the output voltage, applied to comparator 12 over a third contact 62, is the same as the tuning voltage applied to the comparator from the signal search circuit 7. Since the stepping can be rapid, storage can be obtained rapidly and the control knob 10a can be permitted to return to its rest position under spring pressure, for example, by itself. The comparator 12 is preferably so adjusted that the stop signal is generated only when the stepping voltage has the predetermined relation to the control voltage. By a proper interlock circuit, the reset circuit forming the reset source 60, and winding 52 and contact 59 can be omitted. A single main power control can be obtained through switch 63 supplying operating voltage both for comparator 12, as well as for all pulse sources, if storage of a particular tuning position, as determined by a tuning voltage, is to be made.

Figure 5:
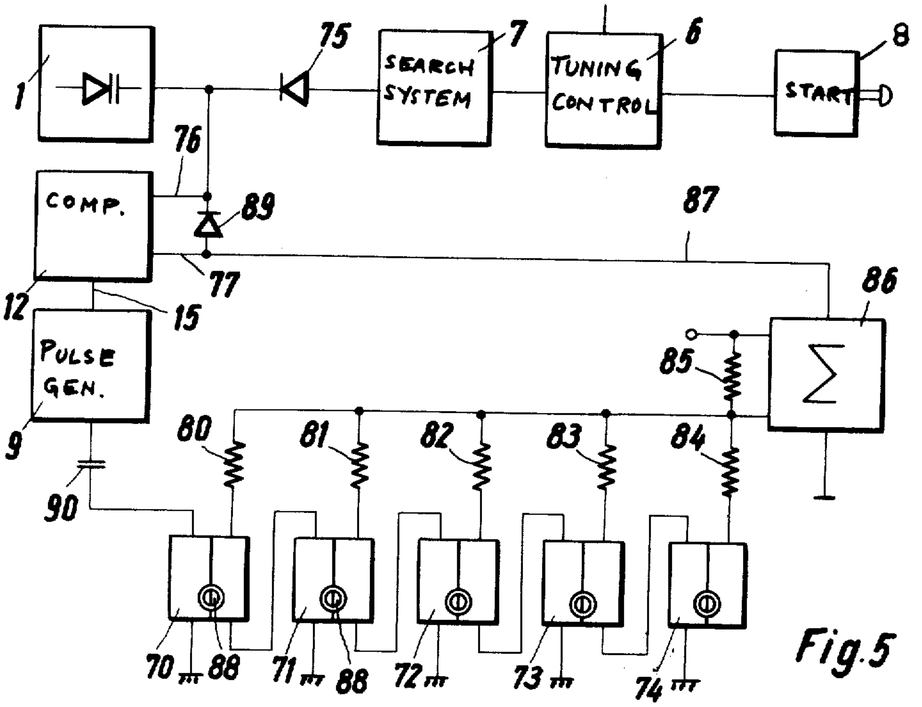
FIG. 5 is a general block and schematic diagram of a receiver according to FIG. 2 and utilizing a ring counter to store a tuning position.

Upon operation of a selected button 10a, 10'a, the stored tuning control voltage is applied to the signals search system 7, and the signal search system voltage will increase until this proper tuning voltage has been reached. FIG. 5 illustrates a circuit in which a plurality of digital flip-flop stages 70 to 74 are serially interconnected in binary progressing relationship. The receiver operates as discussed in connection with FIG. 2, that is the comparator 12 permits operation of the pulse generator only when the tuning voltage is greater than the voltage of one step of the stepped output. The voltage to control tuning of the receiver, in unit 1, is applied from the signal search system over a diode 75, and then directly to the input line 76 of comparator 12. This voltage must be greater by one voltage step than the stepped voltage applied to the second input 77 and derived from stages 70–74. The comparator 12 need not have the output transistors illustrated in FIG. 3, the output thereof being connected to one of the load resistances 42, 43. Alternatively, a single output transistor 45, 46 may be used, connected as well known in the art.

Flip-flop stages 70–74 are interconnected in form of a stepping counter. The pulses first trigger stage 70; then 71; then 70 and 71; then 72; then 70 and 72; then 71 and 72; then 70, 71, 72; next 73 ... and so on, and interconnect output resistances 80 to 84, associated with each stage, to a fixed potential, for example ground. By suitable choice of the values of the resistances 80 to 84, which may be parts of a voltage divider, an output voltage can be obtained which changes in 63 approximately equal steps, and then returns to its initial value. If resistances 80 to 84 are so selected that the resistance of a subsequent stage is approximately half of that of the preceding stage, and a single common resistance 85 is provided with a substantially smaller value than any of resistances 80 to 84 and has a constant potential applied thereacross, then resistance 85 will have current flowing therethrough which increases upon each step by approximately the same amount, so that the voltage across resistance 85 will increase in steps, having the desired stepped output wave shape. This voltage can, if desired, be amplified; alternatively, the single currents can be applied to a summing circuit 86. The output voltage, changing in essentially even steps, is then applied over a line 87 to the input 77 of comparator 12.

Each one of the flip-flop stages contain a core 88 which stores magnetically the state of the particular stage. Thus, if the receiver is turned off, and then re-energized, the previously set counting stage of the counter chain formed of flip-flops 70–74, is retained.

Adding only a single stage doubles the number of output steps, so that small steps can be obtained with a comparatively small number of so that tuning inaccuracies can be easily avoided and a selected receiver can be accurately tuned, and the tuning recaptured after the receiver has been turned off.

The stepped output voltage, as obtained in FIG. 5, can be applied at the same time over a diode 89 to the tuning circuit 1 of the receiver. Diode 89 is so poled, that the voltage from the stepping circuit is applied to the tuning circuit only when it is larger than the voltage derived from the tuning control, for example the signal search system 7. Upon re-energizing the receiver after previous interruption, only the greater, stored voltage will be applied by diode 89 to tuning control. 1. The tuning will thus be determined, and fixed until the tuning control 7 provides a greater output potential, for example by selecting the next subsequent transmitter providing a suitable radiated signal. Upon increase of the tuning control potential, for example after operation of the starting control, to a higher value than the next stepped potential, pulse generator 9 is released from inhibition, that is, is permitted to provide further pulses over a condenser 90 to the flip-flop chain 70–74 which continues to step the flip-flops to provide further digital output signals in binary sequence.

Other known electronic storage circuits than those specifically shown can be used; and other voltage comparators can be connected. The various circuits which have not been discussed in detail, but have been described in block form, for example the search circuit 7, and the entire circuit of the receiver are all well known. Interconnection of the circuits of FIG. 3 to 5 with any one of the systems illustrated in connection with FIGS. 1 or FIG. 2, or with other receivers, will be obvious to those skilled in the art. In particular, reference can be had to the "General Electric Transistor Manual" chapter on radio and communication receivers.

The invention has been described in particular with respect to a receiver utilizing a signal searching system utilizing a variable capacity diode. Other tuning systems may be used, for example manual tuning of tank circuits having variable capacitances or inductances, or electronic tuning by electronically varying the effective inductance, or capacitance within a tank circuit, or by selectively connecting capacitances, or inductances or varying values into the respective tank circuits, mechanically or electronically.

I claim:

1. Tuning system for communication receivers adapted to be connected to a power source comprising
   means (7) providing a progressively variable control signal which varies with tuning frequency of the receiver;
   a pulse source (9) and a digital stepping circuit (11) controlled by said pulse source, said stepping circuit providing a stepped digitally changing signal;
   a comparator circuit (12) having said stepped signal and said control signal applied thereto and comparing characteristics of said signals;
   and magnetic means (9, 10, 11; FIG. 5) included in said system and connected to said comparator and storing a characteristic of one of said signals upon detection of coincidence of both said signals by said comparator circuit, said magnetic means storing said characteristic even upon disconnection of the system from the power source.

2. System according to claim 1 wherein said comparator is connected to said pulse source to inhibit further stepping of said digital stepping circuit upon detection of coincidence of the characteristics of said signals.

3. System according to claim 1 for use in a signal searching receiver, further comprising
   a signal searching system (7) providing an output signal upon detection of a radiated signal of sufficient strength for reception;
   and means (line 17; FIG. 2) connected to said storing means applying an initial signal to said searching system from said storing means upon re-energization of the receiver after interruption of the energization thereof.

4. System according to claim 3 wherein said comparator is connected to said pulse source to inhibit further stepping of said digital stepping circuit;
   and wherein said output signal controlling said searching system is a varying voltage;
   said stepped signal is a digitally varying voltage;
   and the voltage of the digital value stored in said storing means upon coincidence of said control and said stepped signals is applied to said searching system as an initial bias voltage upon re-energization of the receiver.

5. System according to claim 3 wherein the pulse source causes stepping of said digital stepping circuit (11) in binary progression;

and said comparator (12) is connected (line 15) to said pulse source to inhibit application of further pulses to said stepping circuit upon coincidence of the voltage controlling said searching system and voltage value from said digital stepping circuit.

6. System according to claim 1 wherein the stepping circuit comprises a plurality of flip-flop circuits (FIG. 5: 70–74) interconnected as a progressing counter;

resistances (80–84) connected to the output of each flip-flop circuit and having values providing said digitally stepped output voltage, the resistances connected to any one flip-flop having half, or double the value of the resistance of a next adjacent resistor.

7. System according to claim 6 wherein up to seven flip-flop stages are present providing 255 discrete digitally stepped output voltages;

and a summing amplifier (86) matching the output voltage steps to the varying voltage controlling said searching system, is provided.

8. System according to claim 6 wherein each flip-flop includes a rectangular-hysteresis core (88) storing the condition of the flip-flop upon interruption of supply power to the receiver, said cores forming the magnetic means.

9. System according to claim 1 wherein said pulse source provides square wave pulses;

and said digital stepping circuit (11) comprises at least one transfluxor (FIG. 4: 50) and providing a stepped and varying output voltage when pulsed by said pulse source, said transfluxor forming the magnetic means.

10. System according to claim 1 wherein said comparator (12) comprises:

a difference amplifier (FIG. 3) having a pair of load resistances (42, 43);

a single output resistance (30) having an extreme voltage value applied thereacross upon coincidence of said signals applied to said comparator;

and a semiconductor junction element (45, 46) interconnecting said load resistances (42, 43) in parallel, selectively, with said single output resistance.

11. System according to claim 2 for use in a signal searching receiver, wherein said means providing a tuning control signal comprises a signal searching system (7), said signal searching system being connected to one input of said comparator (12);

and wherein said comparator is adjusted to permit stepping of said stepping circuit (11) only if the difference between the tuning control signal from said signal searching system (7) and a digital stepped voltage from said stepping circuit (11) is at least as great as the value of one step of said stepped signal.

12. System according to claim 2 for use in a signal searching receiver, wherein said means providing a tuning control signal comprises a signal searching system (7), said signal searching system being connected to one input of the comparator (12) and providing a varying voltage thereto;

said digital stepping circuit (11) providing a stepped voltage connected to the other input of said comparator (12);

said storing means storing the voltage value supplied by said stepping circuit upon coincidence of two inputs of the comparator;

said stored voltage being applied to the tuning system of the receiver, or the search system, respectively, upon re-energization of the receiver after interruption thereof.

13. System according to claim 12 wherein, upon re-energization of the receiver, the greater of the voltages from the comparator, or from the search system, is applied to the tuning circuit of the receiver as a tuning control signal.

14. System according to claim 1 and further comprising a plurality of manually operable storage control keys (10a);

and storage means connected to said storage control keys and storing a discrete digital voltage, each, upon operation of said keys, as said voltage varies in steps during tuning of the receiver.

15. Tuning system for communication receivers adapted to be connected to a power source, and subject to be disconnected therefrom, comprising means providing a tuning control signal;

a variable capacity diode, having a bias applied thereto which changes as said tuning control signal changes, to provide tuning of the variable capacity diode under control of said tuning control signal;

and magnetic means included in said system and connected in circuit with said tuning control signal to store a characteristic thereof and provide a memory of the tuned position of said variable capacity diode, upon disconnection from the power source.

16. Tuning system according to claim 15, wherein the means providing a tuning control signal comprises a pulse source and a digital stepping circuit controlled by said pulse source, said stepping circuit providing a stepped, digitally changing signal.

17. Tuning system according to claim 16, wherein the stepping circuit comprises a plurality of flip-flop circuits, each including a magnetic core storing the condition of the flip-flop upon interruption of power supply to the receiver, said cores forming the magnetic means.

18. System according to claim 15, wherein the magnetic means comprises a transfluxor.

* * * * *